US007687709B2

(12) United States Patent
Cunningham et al.

(10) Patent No.: US 7,687,709 B2
(45) Date of Patent: Mar. 30, 2010

(54) PHOTOVOLTAIC DEVICE

(75) Inventors: Daniel W. Cunningham, Fairfield, CA (US); Marc P. Rubcich, Walnut Creek, CA (US)

(73) Assignee: BP Corporation North America Inc., Warrenville, IL (US)

( * ) Notice: Subject to any disclaimer, the term of this patent is extended or adjusted under 35 U.S.C. 154(b) by 734 days.

(21) Appl. No.: 11/143,153

(22) Filed: Jun. 2, 2005

(65) Prior Publication Data
US 2005/0224111 A1     Oct. 13, 2005

Related U.S. Application Data

(62) Division of application No. 10/140,092, filed on May 7, 2002, now Pat. No. 6,913,943.

(60) Provisional application No. 60/289,481, filed on May 8, 2001.

(51) Int. Cl.
*H01L 31/00* (2006.01)

(52) U.S. Cl. ............................................ 136/260; 136/256
(58) Field of Classification Search ................ 136/260, 136/256
See application file for complete search history.

(56) References Cited

U.S. PATENT DOCUMENTS

| 5,501,744 A * | 3/1996 | Albright et al. | 136/258 |
| 6,169,246 B1 * | 1/2001 | Wu et al. | 136/265 |

* cited by examiner

*Primary Examiner*—Jeffrey T Barton
(74) *Attorney, Agent, or Firm*—Thomas E. Nemo

(57) ABSTRACT

This invention is a layered thin film semiconductor device comprising a first transparent layer; a thin, second transparent layer having a conductivity less than the first transparent layer; an n-type layer; and a p-type layer comprising one or more IIB and VIA elements. This invention is also a method for making such semiconductor device. The thin film semiconductor devices of this invention are useful for making photovoltaic devices.

8 Claims, 1 Drawing Sheet

US 7,687,709 B2

PHOTOVOLTAIC DEVICE

This is a division of application Ser. No. 10/140,092 filed May 7, 2002 now U.S. Pat No. 6,913,943.

FIELD OF THE INVENTION

This application claims the benefit of Provisional Patent Application No. 60/289,481,, filed on May 8, 2001.

This invention relates to a new, thin film semiconductor device. More particularly, this invention relates to a new thin film photovoltaic semiconductor device having improved efficiency in converting solar or other light energy into electrical energy. This invention also relates to a method of manufacturing such semiconductor and photovoltaic device.

BACKGROUND OF THE INVENTION

Solar power is an important source of renewable electrical energy. The continuous challenge in the field of solar energy is to develop and manufacture photovoltaic devices having a high efficiency for converting sunlight into electrical energy. The more efficient the photovoltaic device is at performing such a conversion, the greater amount of electricity can be generated for a given investment. While a number of different types of photovoltaic devices have been developed, a particularly suitable photovoltaic device is a thin film semiconductor device having at least one layer, a p-layer, comprising one or more IIB elements and one or more VIA elements from the Periodic Table of Elements. One such photovoltaic device is referred to as a CdTe device because the IIB and VIA elements are cadmium and tellurium, respectively. Typically, these photovoltaic devices also have an n-layer or window layer generally comprising cadmium sulfide. Such a device is sometimes referred to as a CdS/CdTe device or cell. They also typically have a transparent, electrically conductive first contact and a second, generally opaque, electrically conductive second contact. In a usual configuration, these devices have a first transparent conductive layer of conductive metal oxide which is a first electrical contact, an n-layer or window layer of the n-type comprising cadmium sulfide deposited on the first transparent conductive layer, a p-layer deposited on the n-layer and a second, generally opaque electrical contact deposited on the p-layer. The junction of the n-layer and the p-layer is a heterojunction, as is known in the art, and is responsible for the generation of electric potential and electric current when the semiconductor device is exposed to light energy, such as sunlight. Light enters the device from the side of the first transparent layer. Such devices have demonstrated superior efficiency and power generation compared to other types of thin film photovoltaic devices. See for example the article by D. Cunningham et al., "Large Area Apollo Module Performance and Reliability," 28th IEEE Photovoltaic Specialists Conference, Anchorage, Ak., September 2000. However, while such CdTe thin film, semiconductor photovoltaic devices are efficient and are also amenable to commercial manufacturing methods, the art needs such photovoltaic devices with improved efficiency. The present invention provides for such thin film, semiconductor photovoltaic devices having improved efficiency in converting sunlight into electric current.

SUMMARY OF THE INVENTION

This invention is a layered thin film semiconductor device comprising a first transparent layer; a thin, second transparent layer having a conductivity less than the first transparent layer; an n-type layer; and a p-type layer comprising one or more IIB and VIA elements. This invention is also a method for making such semiconductor device. The thin film semiconductor devices of this invention are useful for making photovoltaic devices.

DETAILED DESCRIPTION OF THE INVENTION

Figure 1:
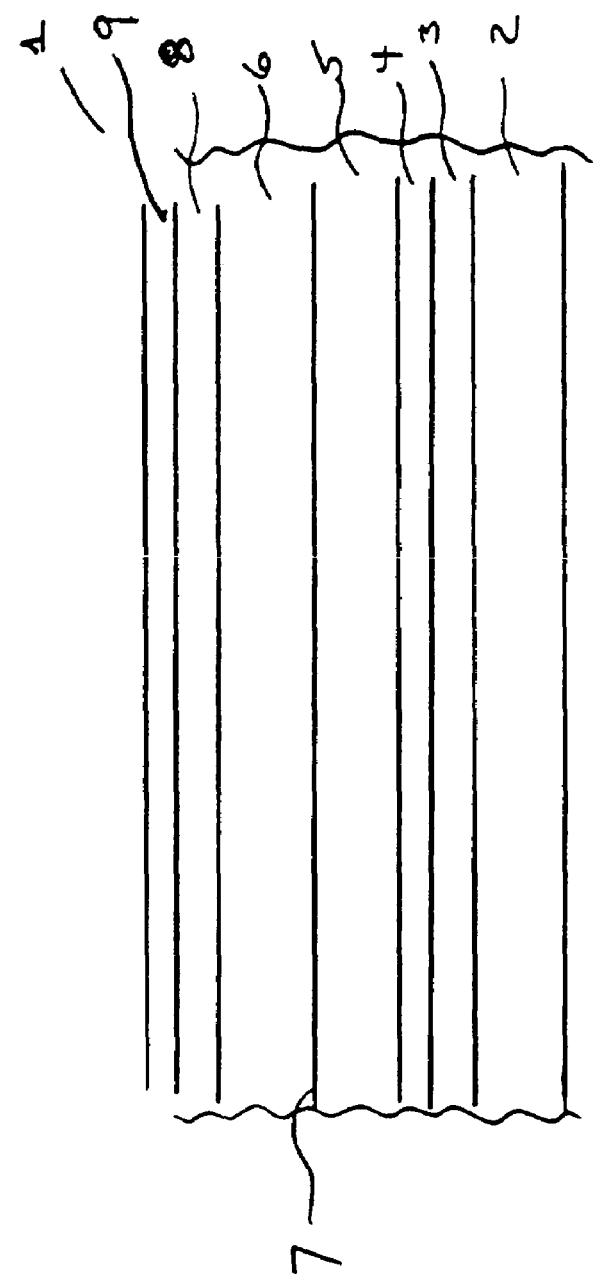
FIG. 1 shows the layered structure of one of the embodiments of this invention.

This invention comprises a layered, thin film semiconductor device suitable for generating electrical current upon exposure to light energy, particularly solar energy. In one embodiment, the invented layered, thin film device comprises a first transparent layer comprising a conductive material, a thin second transparent layer having a resistivity more than the resistivity of the first transparent conductive layer, an n-type layer and a p-type layer; the p-type layer comprising one or more IIB and VIA elements of the Periodic Table of Elements. As used herein, the term n-type means a negatively doped semiconductor and the term p-type means a positively doped semiconductor. In a preferred embodiment, the layered, thin film semiconductor device is supported by or deposited on a suitable substrate material such as a glass, plastic or metal. Preferably the substrate material is glass, preferably a clear glass and preferably the glass is in the form of a flat sheet.

The substrate material is most preferably clear, flat glass, and can have any shape but is generally square or more preferably rectangular. The thickness of the glass can be any thickness that provides for the necessary support of the thin film semiconductor device but generally is about 0.2 to about 5 millimeters in thickness.

Preferably, the first transparent layer comprises one or more conductive metal oxides such as tin oxide, zinc oxide, indium tin oxide, or a mixture of one or more of these oxides, or some other conductive and transparent material. The first transparent layer is typically about 0.4 to about 0.7 microns in thickness, more preferably about 0.45 to about 0.5 microns in thickness. Suitable methods for forming the first conductive layer include spray pyrolysis or chemical vapor deposition (CVD). The first transparent layer is suitably applied directly onto the substrate. A preferred first layer used in this invention is a layer of tin oxide applied to a glass substrate by CVD and further comprising fluorine dopant to decrease the resistivity of the first transparent layer to the desired resistivity. Preferably, the first transparent layer has a resistivity of about $1\times10^{-4}$ to about $5\times10^{-4}$ ohm·cm. Flat glass substrates containing the first conductive layer comprising tin oxide doped with fluorine can be purchased from suitable glass manufacturers and suppliers.

The second transparent layer of the thin film semiconductor device of this invention is a thin layer having a resistivity more than the resistivity of the first transparent layer. By thin we mean, preferably, the layer has a thickness of up to about 0.075 microns, or up to about 0.065 microns, or up to about 0.05 microns, more preferably about 0.01 to about 0.05 microns, and still more preferably of about 0.015 to about 0.035 microns. Preferably, the thin, second transparent layer is at least about 0.01 microns in thickness. Preferably, the second transparent layer comprises one or more conductive metal oxides such as tin oxide, zinc oxide, indium tin oxide, zinc stannate, a mixture of one or more of the above, or some other conductive and transparent material. Preferably, the second transparent layer comprises a metal oxide and is, preferably, the same metal oxide used in the first conductive layer but is doped differently so that its more resistive than the first transparent layer. Preferably, the second transparent layer comprises a mixture of tin and zinc oxides. The molar ratio of tin oxide to zinc oxide in the mixture is suitably about 99.9:0.1 to about 95:5, preferably about 99.5:0.5 to about 98:2, and more preferably about 99.2:0.8 to about 98.8:1.2. The second transparent layer is preferably deposited next to and in immediate contact with the first transparent layer. The method used for depositing the second transparent layer is any suitable method that will provide the thin film of second transparent layer. For example, CVD, spray pyrolysis or physical vapor deposition can be used to form or deposit the second transparent layer. However, we discovered that the preferred method to form and deposit the second transparent layer is to use reactive direct current (DC) sputtering. In this process, a metal or a mixture of metals, for example elemental tin, elemental zinc, or mixtures thereof which may be in atomic ratios the same as the molar ratios mentioned above for tin oxide and zinc oxide, is sputtered onto the substrate. Indium can also be used alone or in combination with either or both tin and zinc. In the preferred method, such a mixture of metals is sputtered directly onto and in direct contact with the first transparent layer. In the reactive DC sputtering method, the metal or metals, for example, a mixture of elemental tin and elemental zinc in an atomic ratio of about 99:1, respectively, are sputtered onto the substrate using, for example, an AirCo Thin Film Coater in an oxidizing atmosphere at a temperature of about 30° C. to about 90° C. and at a pressure of about 0.1 millitorr to about 5 millitorr. The oxidizing atmosphere can be any atmosphere that will serve to convert the sputtered metal or metals to oxides during the sputtering process. For example, the oxidizing atmosphere can be a mixture of oxygen gas with one or more inert gasses such as argon, helium or nitrogen such that the ratio of oxygen gas to inert gas is about 99:1 to about 1:99. The oxidizing atmosphere can be oxygen gas. After the sputtering, the layer deposited is optionally heated in air or an oxidizing atmosphere, such as the oxidizing atmosphere described above, suitably at about 400° C. to about 500° C. for about 5 to about 60 minutes, more preferably about 10 to about 30 minutes. Preferably all, or substantially all, of the sputtered metal in the layer is in its oxide form. By "substantially all" we mean, preferably, that at least about 98 percent, more preferably at least about 99 percent and most preferably at least about 99.9 percent of the metal in the deposited layer is in the oxide form. We determined that the use of reactive DC sputtering as the method for depositing the second transparent layer provides for a more efficient photovoltaic device of this invention compared, for example, to the same device where the second transparent layer is applied by sputtering the metal followed by oxidation of the sputtered metal to the oxide by heating in air. Photovoltaic devices of this invention having a second transparent layer made by reactive DC sputtering a mixture of tin and zinc metal were also superior to photovoltaic devices of this invention having a second transparent layer made by chemical vapor deposition of tin oxide or sputtered tin oxide.

The second transparent layer has a resistivity more than the resistivity of the first transparent layer. For example, the resistivity of the second transparent layer is up to about $1 \times 10^6$ times more resistive, preferably about $1 \times 10^4$ to about $5 \times 10^5$ times more resistive than the first transparent layer. In absolute terms, the resistivity of the second transparent layer is suitably up to about 100 ohm·cm, preferably about 1 to about 15 ohm·cm, and more preferably about 5 to about 10 ohm·cm. The transparency of the second transparent layer is suitably at least about 90 percent, preferably at least about 95 percent and more preferably at least about 99 percent, as measured by spectrophotometric methods. The second transparent layer may be textured. Such texturing may be accomplished by, for example, modulating the deposition rate of the metal oxides, etching after deposition with an acid such as hydrofluoric or hydrochloric acid, or with a base such as sodium hydroxide, or by plasma or reactive ion etching. Although the second transparent layer in the invented semiconductor device may be crystalline or polycrystalline, it may be at least partially amorphous, for example, at least about 50 weight percent amorphous. Preferably it is amorphous or substantially amorphous. By substantially amorphous we mean, preferably, that the layer is at least about 95 weight percent amorphous, more preferably at least about 98 weight percent amorphous and most preferably at least about 99 weight percent amorphous. Although the second transparent layer has been described hereinabove as a separate layer, it is to be understood that the second layer can be continuous with the first layer in that instead of a discrete boundary between the first layer and second layer there is a continuous or graded change in composition so as to achieve the purposes of the first transparent layer and second transparent layer as described herein. Thus, for example, rather than depositing a first transparent layer then switching to deposit the second transparent layer, the composition of the feedstock used to deposit the first layer, for example, tin or tin oxide, can be switched during the deposition process for example, to a mixture of tin and zinc or tin oxide and zinc oxide, so that although there may not be a discrete separation of the two layers, the regions deposited will function in the same manner as discrete layers.

The n-layer in the thin film semiconductor device of this invention is any suitable material that provides for compatibility with and capable of forming a heterojunction with a suitable p-layer. Preferably, the n-layer forms a heterojunction with a p-layer, preferably a CdTe p-layer, that will generate electrical charge separation upon exposure to light energy, preferably solar light energy. Preferably, the n-layer, also known as the window layer, comprises cadmium sulfide (CdS), but it can also comprise zinc sulfide, cadmium zinc sulfide, or one or more mixtures of any of the above. The CdS layer can be deposited by any suitable method. For example, it can be deposited by contacting the substrate (having the second transparent layer deposited on the first transparent layer) with an alkaline aqueous medium comprising a source of cadmium ion, sulfide ion (or precursor thereof, a colloid stabilizer and, preferably, a complexing agent for cadmium ion. The cadmium source is usually a water-soluble salt or complex, for example, an inorganic salt such as cadmium chloride or sulfate, or organic salt, for example a carboxylate such as cadmium acetate. The aqueous medium may contain about 0.3 to about 10, preferably about 0.5 to about 2.5, and more preferably about 1 to about 5 grams per liter of cadmium. The sulfide is usually a hydrosulfide ion or preferably an inorganic or organic precursor thereof. The precursor, if used, is preferably water soluble, for example, to an extent of at least about 1 or preferably at least about 10 grams per liter. Examples of inorganic sulfide are hydrogen sulfide, metal sulfides including alkali metal sulfide such as sodium sulfide, alkaline earth metal sulfide such as calcium sulfide, or a nonmetal or insoluble metal sulfide such as phosphorus pentasulfide or aluminum sulfide, respectively. Preferably the precursor is organic and is hydrolyzable, especially under alkaline conditions to give the sulfide ion. Examples are thiocarbonyl compounds such as thio-ketones and aldehydes such as thioformaldehyde and thioacids and amides thereof especially thio acids and amides, in particular thioacetamide and thiourea, as well as thiolacids (RC=O(SH). The aqueous solution may contain about 0.01 to about 20, preferably about 0.05 to about 5, and more preferably about 0.1 to about 1 gram of sulfide or sulfide precursor (expressed by weight as sulfur) per liter of aqueous medium.

The colloid stabilizer is a material added to a colloidal dispersion to stabilize the dispersion. Such stabilizers are known in the general field of colloid chemistry. The colloidal stabilizer may be an inorganic salt of a complex polyacid such as one of Group VA, VB or VIA of the Periodic Table of the Elements, such as phosphorus, molybdenum or tungsten, for example, a polyphosphate or a heteropolyacid. Sodium metal phosphate and sodium tripolyphosphate are preferred. The colloidal stabilizer may also be a polymeric water soluble hydrophilic compound, such as a synthetic polymer, for example, polyvinyl alcohol or poly(meth)acrylic acid or polyvinyl pyrrolidone, or a natural polymer, such as vegetable gum, for example, guar gum, or gelatin or xanthan gum. The colloidal stabilizer may be present in the aqueous medium in amounts of about 0.01 to about 30, preferably about 0.05 to about 20, and more preferably about 0.05 to about 5 grams per liter of the aqueous medium.

The complexing agent, which is preferably present in the aqueous medium, complexes the cadmium ion under the pH conditions in the medium. The complexing agent is usually water soluble and, preferably, nitrogenous, preferably with at least one amino nitrogen atom, for example 1 to about 4 amino nitrogen atoms, and may be added as free base or as an amine salt. Thus, the complexing agent may be ammonia, usually added as an ammonium salt, for example a halide such as a chloride, a nitrate or a sulphate. It may also be a halide, nitrate or sulfate of a primary, secondary or tertiary organic amine and, in particular, of an aliphatic amine such as an amino alkane, which may also have at least one hydroxyl substituent. Examples of such organic amines are mono-, di- and triethanolamine and propanolamine. Other suitable amines are alkylene diamines such as ethylene diamine, and amino acids such as ethylene diamine tetracetic acid. The concentration of complexing agent in the aqueous medium is usually about 10 to about 200, preferably about 40 to about 100 grams per liter of aqueous medium. In particular, the ratio of moles of complexing agent to Cd atoms is usually about 1:1 to about 1000:1, for example, about 50:1 to about 500:1.

The aqueous medium usually has a pH of about 8 to about 13, preferably about 9 to about 12.5, which may be achieved by addition of alkali, for example, sodium hydroxide, a basic complexing agent such as ammonia, or both.

The deposition process is usually performed at a temperature of about 20 to about 90° C., preferably about 50 to about 80° C., and in a time of about 5 to about 100 minutes, preferably about 10 to about 50 minutes. The aqueous medium may be unagitated or may be agitated either periodically or continuously. The process may be performed by mixing all the components and allowing reaction to occur, but preferably the stabilizer and cadmium ion, optionally with complexing agent, are mixed first to give a solution thereof and then to this is added the sulfide or precursor thereof. The preferred method to form a CdS layer for the thin film semiconductor of this invention is to use a chemical deposition process where the CdS is deposited by immersing the substrate containing the first and second transparent layer deposited thereon in a bath containing a warm alkaline solution containing the cadmium complex ($[Cd(NH_3)_4]^{2+}$) and thiourea. Such processes are disclosed, for example, in N. R. Pavaskar, et al., J. Electrochem. Soc. 124 (1967) p. 743, and in I. Kaur, et al., J. Electrochem. Soc. 127 (1981) p. 943 which are both incorporated herein by reference. Irrespective of the method used, the CdS layer can be deposited to a thickness of up to about 0.12 microns. After deposition of the CdS layer, it is typically heated in air at a temperature of about 300° C. to about 500° C., preferably at about 350° C. to about 450° C. for about 10 to about 60 minutes, more preferably about 15 to about 40 minutes, to anneal the CdS layer. During this annealing process it is believed that the CdS layer undergoes densification and grain growth.

We discovered that the CdS layer in the thin film semiconductor device of this invention can be made much thinner than the CdS layers in prior photovoltaic devices containing CdTe and CdS layers. For example, in the thin film semiconductor device of this invention the CdS layer or n-layer can be thin. By thin we mean, preferably, up to about 0.07 microns in thickness, more preferably about 0.01 to about 0.065 microns in thickness, and most preferably about 0.04 to about 0.06 microns in thickness. Such thin CdS layers are desirable because the CdS layer, although a window layer, nevertheless absorbs light energy which we believe contributes to the lowering of the efficiency of a CdS/CdTe photovoltaic device. Consequently, the thinner CdS layer or n-layer of the thin film semiconductor device of this invention when used in a photovoltaic device results in a more efficient photovoltaic device for converting light energy into electrical energy.

The p-layer in the thin film semiconductor device of this invention preferably comprises one or more IIB elements and one or more VIA elements of the Periodic Table of Elements as appearing in "Advanced Inorganic Chemistry" by Cotton and Wilkinson, $4^{th}$ Edition, in which the Group IIB elements include cadmium and the Group VIA elements include selenium and tellurium. The preferred p-layer comprises cadmium and tellurium which may also contain mercury as disclosed in U.S. Pat. No. 4,548,681 which is incorporated herein by reference. Additionally, the p-layer may contain quantities of dopants such as one or more of copper, gold or silver as disclosed in EP Patent 244963 which is incorporated herein by reference. Other p-type layers include, for example, copper indium diselenide, copper sulfide, copper indium disulfide, GaSb, GaAs, $Sn1_{\pm x}Se$, InSb, $CuInSe_{2-x}$, and along with CdTe one or more mixtures thereof, or one or more of the p-type layers disclosed in U.S. Pat. No. 4,753,684 which is incorporated herein by reference. However, the preferred p-layer comprises Cd and Te, preferably CdTe, with or without mercury or the dopants mentioned above. Preferably the CdTe p-layer is deposited by electrodeposition. A suitable method for electrodeposition of a CdTe layer as well as other suitable IIB and VIA elements is disclosed in Panicker, et al., "Cathodic Deposition of CdTe from Aqueous Electrolytes," J. Electrohem. Soc. 125, No. 4, 1978, pp. 556-572, and in U.S. Pat. No. 4,400,244 which are both incorporated herein by reference. In this method, deposition of CdTe takes place from an aqueous solution of $CdSO_4$ to which $TeO_2$ has been added and the electrodeposition is carried out onto the substrate having the first and second transparent layers, and the CdS layer deposited thereon. Preferably, in the solution the concentration of $Cd^{2+}$ ions is about 0.2 to about 1.5 molar, and the concentration of $HTeO_2+$ ions is about $10^{-5}$ molar to about $10^{-3}$ molar, and the pH of the solution is suitably about 1 to about 3, and is conveniently adjusted by an acid such as sulfuric or hydrochloric acid. In such an electrochemical method, $HTeO_2+$ at the cathode reacts with $Cd^{2+}$ ions to form cadmium telluride which is deposited on the glass substrate cathode. In the semiconductor device of this invention, the p-layer having IIB and VIA elements, for example, a p-layer of CdTe, copper indium diselenide, GaSb, GaAs, $Sn_{1\pm x}Se$, InSb, $CuInSe_{2-x}$ or one or more mixtures thereof, and particularly a CdTe p-layer, is preferably deposited by electrodeposition directly onto and in direct contact with the CdS window layer. Methods for the electrodeposition of suitable p-layers or precursors therof useful in this invention are also disclosed in EP Patent 0538041 which is incorporated herein by reference.

A CdTe layer deposited electrolytically as described above has n-type conductivity and, therefore, cannot form a rectifying heterojunction with a CdS n-type layer capable of generating electrical energy upon exposure to light renergy. To produce a rectifying junction, the n-type CdTe layer is heat treated in air at, for example, a temperature of about 250 to about 500° C. for a time sufficient, for example, about 5 to about 10 minutes, to convert the n-type CdTe layer to a relatively low resistivity p-type layer. Such a heating process is disclosed in U.S. Pat. No. 4,388,483 which is incorporated herein by reference.

The p-type layer in the thin film semiconductor device of this invention is typically up to about 5 microns in thickness, preferably about 0.5 microns to about 3.0 microns in thickness, and more preferably about 1.5 to about 2.5 microns in thickness. During the heat treatment of the CdTe layer as described above, the CdTe layer preferably recrystallizes and undergoes grain growth.

The semiconductor devices of this invention, if used as a photovoltaic device, generally have a back contact. This back contact is preferably deposited on and in direct contact with the p-layer. The back contact is suitably made from one or more highly conductive materials. The conductive back contact may be, for example, one or more of elemental nickel, chromium, copper, tin, aluminum, gold, silver, technecium or alloys or mixtures of any of the above such as, for example, an alloy of tin and zinc. It can be layers of one or more metals such as the metals just mentioned, for example a layer of nickel and a layer of chromium. It can be made from blends of graphite and polymeric materials, carbon pastes and, it can also be a transparent conductive oxide such as, for example, the conductive oxides described hereinabove useful for the first transparent layer. The back conductive contact can be a layer of carbon deposited on the p-layer followed by one or more layers of metal, such as the metals described above. The back conductive contact, if made of or comprising one or more metals, is suitably applied by a technique such as sputtering or metal evaporation. If it is made from a graphite and polymer blend, or from a carbon paste, the blend or paste is applied to the semiconductor device by any suitable method for spreading the blend or paste, such as screen printing, spraying or by a "doctor" blade. After the application of the graphite blend or carbon paste, the device is heated to convert the blend or paste into the conductive back contact layer. Suitable carbon-containing pastes or inks can be obtrained from suppliers such as DuPont Microcircut Materials, Mettech Polymers Group, Acheson Colloids Company, and Coates Circuit Products. Suitable back contacts are disclosed in U.S. Pat. No. 4,735,662 which is incorporated herein by reference. A carbon layer, if used, is suitably about 1 to about 10 microns in thickness. A metal layer of the back contact, if used for or as part of the back contact, is suitably about 0.1 to about 1 microns in thickness. Prior to adding the back conductive contact, the p-layer may be treated as set forth in U.S. Pat. Nos. 4,456,630 and 5,472,910 which are incorporated herein by reference. These references teach methods to dope the p-layer and methods to improve the ohmic contact between the p-type layer and the conductive back contact.

When using the semiconductor device of this invention as a photovoltaic device, it is useful to connect a plurality of the devices in series in order to achieve a desired voltage. Any suitable method can be used to accomplish such a connection, for example, electrical wiring or other conductive means can be used to connect a plurality of devices in series. Each end of the series connected cells can be attached to a suitable conductor such as a wire or bus bar, to direct the photovoltaically generated current to convenient locations for connection to a device or other system using the generated electric. A convenient means for achieving such series connections is to laser scribe the device to divide the device into a series of cells connected by interconnects. Methods for interconnecting cells in a series configuration are disclosed in U.S. Pat. Nos. 4,243,432 and 4,383,022 which are incorporated herein by reference. Preferably, a laser is used to scribe the deposited layers of the semiconductor device to divide the device into a plurality of series connected cells. A laser scribing process is disclosed in the article by D. Cunningham et al., "Large Area Apollo Module Performance And Reliability," 28$^{th}$ IEEE Photovoltaic Specialists Conference, Anchorage, Ak., September 2000, which is incorporated herein by reference.

One embodiment of the invention will now be described with reference to FIG. 1.

FIG. 1 shows the layered structure of one embodiment of a thin film, layered semiconductor 1 of this invention. The layers are not drawn to scale in FIG. 1 with respect to the relative thickness of each layer.

In FIG. 1, 2 is a glass substrate, preferably a flat glass substrate made from a high quality float glass. Layer 3 is a first transparent conductive layer comprising tin oxide doped with fluorine atoms to make it conductive. Layer 3 has a thickness of about 0.5 microns and is preferably deposited on the glass substrate by CVD. Alternatively, glass substrate 2 can be purchased from glass suppliers having the layer 3 deposited thereon. Layer 4 is a second transparent layer having a resistivity more than the resistivity of conductive layer 3. Layer 4, for example, has a resistivity of about 1 to about 100 ohm·cm. Layer 4 is a mixture of tin and zinc oxides in a molar ratio of 99:1 formed by reactive DC sputtering and is about 0.03 microns in thickness.

Layer 5 is a CdS n-type or window layer formed by chemical deposition from a bath of a warm alkaline solution of cadmium complex ($[Cd(NH_3)_4]^{2+}$ and thiourea. The deposited CdS is heated in air at about 400° C. for about 30 minutes after deposition. Layer 6 is a p-type layer of CdTe formed by electrodeposition from an acidic bath of $Cd^{2+}$ and $TeO_2$. After electrodeposition, the deposited CdTe layer is heated or annealed in air at a temperature of about 450° C. for about 20 minutes to convert it to the desired p-layer. Upon such heating, the photovoltaically active heterojunction depicted by line 7 is formed between the n-type, CdS layer and the p-type CdTe layer. Layer 8 is a conductive back contact made of carbon formed by applying and heating a carbon-containing ink. Layer 9 is a layer of metal, such as tin, added by sputtering and is about 0.25 to about 0.75 microns in thickness.

Although not wishing to be bound by any theory of operation, we believe that the thin, second transparent layer in the semiconductor device of this invention, and in the photovoltaic device made therefrom, reduces electrical shunting of what would otherwise occur between the CdTe p-layer and the first transparent layer. In prior devices, defects in the CdS n-layer may cause such shunting. In order to reduce the shunting, the thickness of the CdS layer was typically increased. However, upon increasing the thickness of the window CdS layer, there is a concomitant decrease in the efficiency of the photovoltaic device due to the absorption of light by the thick CdS layer. In the semiconductor device of this invention, the thin second transparent layer is believed to alleviate such shunting because of its lower conductivity or higher resistivity. Thus, even though the thinner CdS layer may still have defects, the shunting is reduced or eliminated by the presence of the thin, higher resistivity second transparent layer.

In the semiconductor device of this invention, the second transparent layer, although having a conductivity less than the conductivity of the first transparent layer, has a conductivity preferably sufficiently high to permit the electrodepositon of a CdTe layer as described hereinabove. For example, if the resistivity of the second transparent layer is too large, for example, more than about 15 ohm·cm, or more than about 10 ohm·cm, a CdTe layer deposited by the electrochemical methods as described herein, for example, may be non-stoichiometric. By non-stoichiometric we mean it will not have the preferred Cd:Te atomic ratio. A non-stoichiometric CdTe layer may lead to a less than optimal CdTe absorber layer for conversion of solar energy or other light energy to electrical energy. Thus, the second layer is preferably of a thickness and resistivity to reduce or eliminate shunting associated with thin CdS layer yet of a sufficient conductivity to provide for the prefered stoichiometry of the CdTe layer formed by an electrolytic deposition process. By prefered stoichiometry we mean, preferably, a stoichiometry where the atomic ratio of Cd to Te is within the range $Cd_{1+x}Te_{1+y}$, where x and y are no more than about ±0.01. Stated differently the CdTe stoichiometry should be within 1% of the 1:1 stoichiometry. Preferably the atomic ratio of Cd to Te is substantially 1:1, and most preferably the atomic ratio of Cd to Te is 1:1 in the CdTe layer of the semiconductor device of this invention.

We have also found the thin second transparent layer of the semiconductor device of this invention provides for an improved photovoltaic device, e.g., a device with higher efficiency, compared to a photovoltaic device having a thicker second transparent layer. Photovoltaic devices of this invention comprising the semiconductor device of this invention have an improved Isc without loss of open circuit voltage (Voc) and fill factor (FF) compared to prior art CdS/CdTe photovoltaic devices.

This invention is also a method for making the thin film semiconductor devices of this invention. The method comprises depositing on a substrate, suitably a glass substrate, a first transparent layer as described hereinabove comprising a transparent conductive material as described hereinabove; depositing a second transparent layer as described hereinabove having a conductivity less than the conductivity of the first transparent layer; depositing an n-type, preferably thin, layer as described hereinabove; depositing a p-type layer as described hereinabove or, as also described hereinabove, a layer which can be converted into a p-type layer after deposition; and depositing a second, generally opaque, conductive layer or layers as described above which can serve as an electrical contact. Photovoltaic devices comprising the thin film semiconductor devices of this invention are highly efficient in converting light energy into electrical energy. For example, photovoltaic devices of this invention comprising the thin layer semiconductor devices of this invention have efficiencies of at least about 8.5 percent, of at least about 9.0 percent, of at least about 9.5, of at least about 10, or of at least about 10.5 percent. Efficiencies of at least about 11 or about 11.5 percent can be achieved. Photovoltaic devices comprising the semiconductor devices of this invention have efficiencies of about 11.5 percent to about 8.5 percent, for example about 11 percent to about 9 percent. The efficiency of a photovoltaic device of this invention made using the semiconductor device of this invention can be conveniently and preferably is measured according to ASTM E-948-95.

The following examples are being provided to illustrate certain embodiments of the invention, however, they are not intended to limit in anyway the scope thereof.

Provisional patent application 60/289,481 filed on May 8, 2001, is incorporated by reference in its entirety. All references to the Periodic Table of Elements hereinabove are to the Periodic Table of Elements as appearing in "Advanced Inorganic Chemistry," Cotton and Wilkinson, $4^{th}$ Ed.

EXAMPLES

Thin film photovoltaic devices were made as follows and tested for efficiency in converting light energy to electrical energy. The photovoltaic devices tested had a 3 mm thick float glass sheet as a substrate material. The substrate was coated with a layer of transparent conducting tin oxide about 0.5 to 0.6 microns thick. The conductive tin oxide was applied using chemical vapor deposition and had a resistivity of about $1\times10^{-4}$ ohm·cm. A second transparent layer of tin and zinc oxide in a molar ratio of 99 to 1 was deposited on the first transparent layer using reactive DC magnetic sputtering in an oxygen atmosphere at a pressure of about 1 millitorr. The thickness of the second transparent layer was varied as shown in the Table 1. After deposition, the second transparent layer was heated in air at a temperature of 500° C. for 20 minutes. The second transparent layers had resistivities that were about the same. A 0.05 microns film of cadmium sulfide was deposited on the second transparent layer by chemical deposition by the reaction of cadmium ion with thiourea in an aqueous ammonia solution at a temperature of about 70° C. The cadmium sulfide layer was heated in air at 400° C. for 30 minutes after deposition. A layer of cadmium telluride was deposited on the cadmium sulfide layer by electrodeposition from a bath of cadmium sulfate and tellurium dioxide. Chloride ion was also present and was incorporated in the cadmium telluride layer during the electrodeposition process. The electrodeposited cadmium telluride layer was about 1.8 microns in thickness after deposition. After deposition, the substrate containing the deposited layers was heated in air at 450° C. for 15 minutes. After heat treatment, the cadmium telluride layer was doped with copper at 200° C. A carbon layer was applied to the copper-doped cadmium telluride by screen printing a layer of carbon ink, and the ink was heated at 100-200° C. in air to form a carbon layer about 10 microns in thickness. The carbon layer was then coated with aluminum by sputtering a 0.3 microns thick layer of aluminum.

Table 1 reports the efficiency of the photovoltaic devices so formed.

TABLE 1

| Thickness of Second Transparent Layer[a] | % Efficiency |
| --- | --- |
| 0.10 | 2.4 |
| 0.075 | 5.1 |
| 0.051 | 7.5 |
| 0.025 | 8.9 |

[a] = microns

The results in Table 1 show an increase in efficiency of the thin film photovoltaic devic as the second transparent layer is made thinner.

Only certain embodiments of the invention have been set forth and alternative embodiments and various modifications will be apparent from the above description to those of skill in the art. These and other alternatives are considered equivalents and within the spirit and scope of the invention.

That which is claimed is:

1. A layered, thin film semiconductor device comprising a first transparent layer comprising a conductive material, a thin, second transparent layer comprising tin oxide and zinc oxide and where the mole ratio of tin oxide to zinc oxide is about 99.9:0.1 to about 95:5 and having a resistivity greater than the first transparent layer, an n-type layer, and a p-type layer comprising one or more IIB and VIA elements.

2. The semiconductor device of claim 1 wherein the second transparent layer is up to about 0.075 microns in thickness.

3. The semiconductor device of claim 1 wherein the second transparent layer is textured.

4. The semiconductor device of claim 1 wherein the second transparent layer is deposited by reactive DC sputtering.

5. The thin film semiconductor device of claim 2 wherein the n-layer comprises cadmium sulfide and the p-layer comprises cadmium telluride.

6. The thin film semiconductor of claim 5 wherein the n-layer is up to about 0.07 microns in thickness.

7. The semiconductor device of claim 1 wherein the resistivity of the second transparent layer is no more than about 15 ohm·cm.

8. The semiconductor device of claim 1 wherein the resistivity of the second transparent layer is no more than about 10 ohm·cm.

* * * * *